(12) United States Patent
Bakker

(10) Patent No.: US 7,119,613 B2
(45) Date of Patent: Oct. 10, 2006

(54) RF AMPLIFIER

(75) Inventor: Theodorus Wilhelmus Bakker, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 83 days.

(21) Appl. No.: 10/502,155

(22) PCT Filed: Jan. 23, 2003

(86) PCT No.: PCT/IB03/00160

§ 371 (c)(1),
(2), (4) Date: Jul. 20, 2004

(87) PCT Pub. No.: WO03/063246

PCT Pub. Date: Jul. 31, 2003

(65) Prior Publication Data

US 2005/0083118 A1 Apr. 21, 2005

(30) Foreign Application Priority Data

Jan. 24, 2002 (EP) ................................. 02075292

(51) Int. Cl.
*H03F 1/00* (2006.01)
(52) U.S. Cl. ............................ 330/67; 330/302; 330/66
(58) Field of Classification Search .................. 330/66, 330/67, 302
See application file for complete search history.

(56) References Cited

U.S. PATENT DOCUMENTS 5,272,450 A * 12/1993 Wisherd ..................... 330/297
5,477,188 A * 12/1995 Chawla et al. .............. 330/269
5,999,058 A * 12/1999 Saitou et al. ................ 330/286
6,046,641 A * 4/2000 Chawla et al. .............. 330/277
6,443,547 B1 * 9/2002 Takahashi et al. ............. 347/9

FOREIGN PATENT DOCUMENTS

EP 0368329 A2 5/1990
GB 2225683 A 6/1990

* cited by examiner

*Primary Examiner*—Patricia Nguyen
(74) *Attorney, Agent, or Firm*—Aaron Waxler; Paul Im

(57) ABSTRACT

A RF amplifier device (22) including an amplifier element (24) compensated by a compensating circuit (26, 28) with respect to its output capacitance and frequency decoupled from its power supply (26), wherein the decoupling circuit is directly connected to the compensating circuit (26, 28) and a RF amplifier device including an amplifier element (56, 80) and a compensating circuit comprising an internal shunt inductor having a compensating inductance (58, 60, 62) and a compensating capacitance (64, 92) and arranged in parallel to a terminal of the amplifier element (56, 80) to compensate a terminal capacitance of the amplifier element (56, 80), and a decoupling and power supply lead (76, 98) which is connected to the compensating capacitance (64, 92) and/or a decoupling circuit (100) and/or a combination of the compensating capacitance and the decoupling circuit (130) and a module thereof and a method for decoupling the mentioned RF amplifier device.

23 Claims, 7 Drawing Sheets

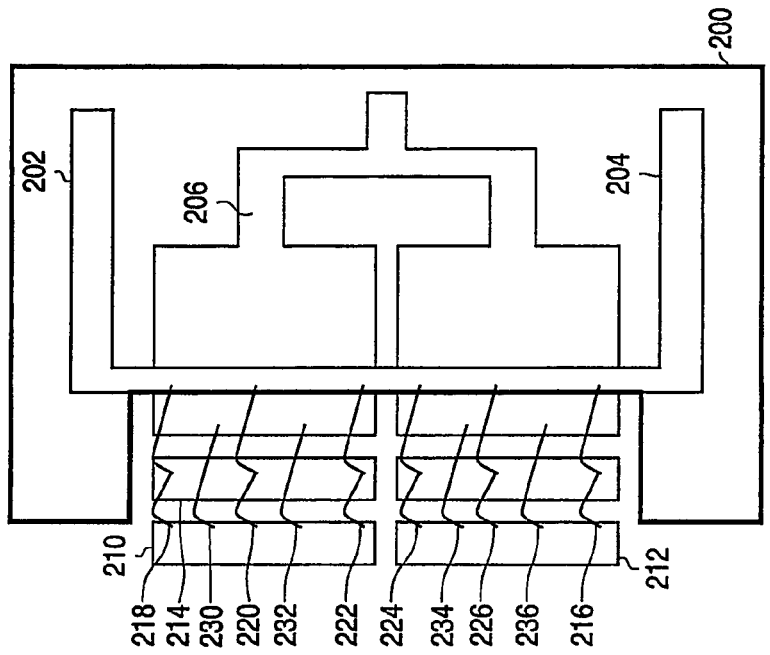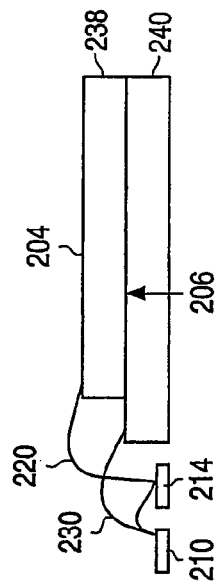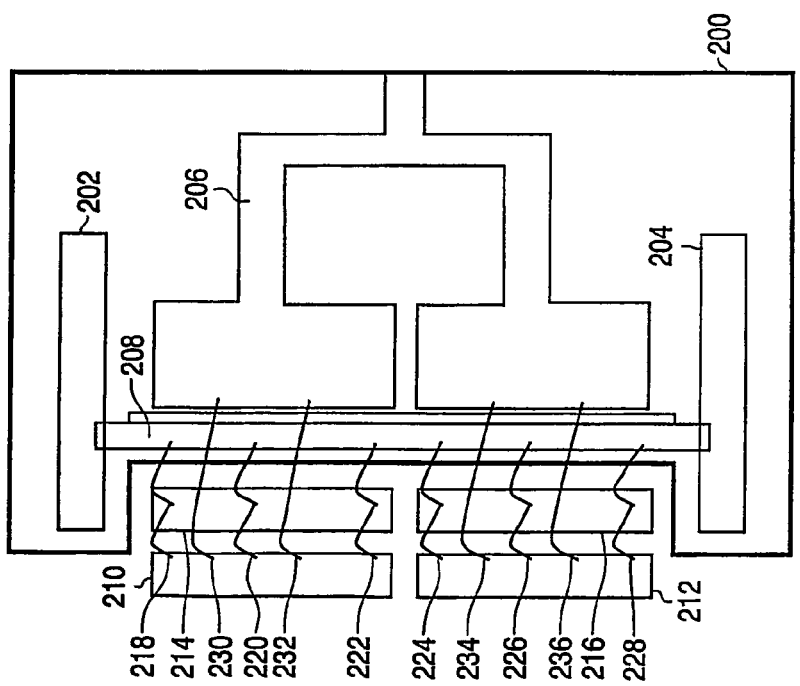

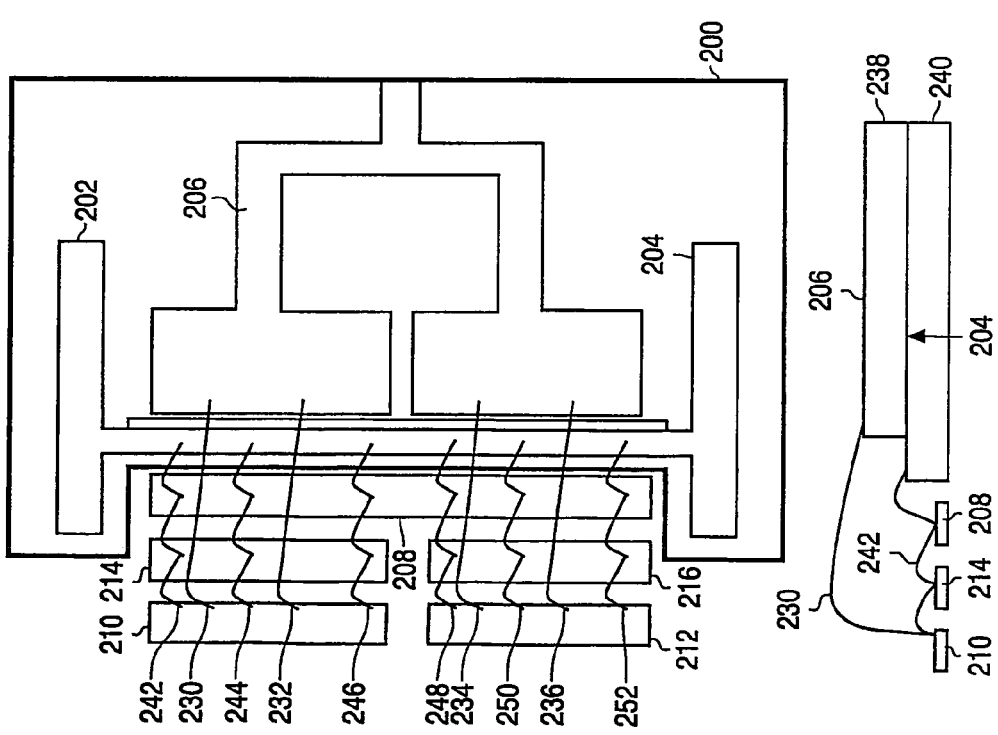

RF AMPLIFIER

The invention relates to a RF amplifier device comprising an amplifier element with a frequency dependent gain, said frequency dependence being caused by an input and/or an output capacitance, said frequency dependence being compensated by a compensating circuit.

Telecommunication providers place transmitters or base stations throughout the landscape, so that everybody can use her or his telephone at any place. These base stations comprise amplifiers. These amplifiers amplify digital signals which are modulated on a high frequency carrier (1 or 2 GHz). The result is a very complex signal having a complex spectrum. For instance GSM, edge-GSM and CDMA are standards which are used for transmitting the data between the base stations and the mobile phones. In successors of these systems, a wide band-CDMA signal, a so called W-CDMA, is used. As the transmitted amount of data is very large, the processing of the data in W-CDMA is the most complex one.

If two (or more) signals with different frequencies are amplified, differential tones or frequencies occur. For example, a first signal with a first frequency and a second signal with a second frequency, will result in a differential third signal C with a third frequency that equals the first frequency minus the second frequency. The differential third signal is not desired since it generates bias modulation effects, resulting in poor linearity and spectrum asymmetry of the amplifier (memory effects). In order to avoid such unwanted effects, it is necessary to eliminate the differential third signal. Therefore, the base station amplifiers require broad band decoupling circuits for differential tones. For standards like (multi carrier) W-CDMA decoupling is required up to 50 MHz. Lower frequencies can be shorted "far away" from the transistor die with electrolytic capacitances, but frequencies above 5–10 MHz need a very short path to the decoupling capacitances in order to be shorted sufficiently.

Furthermore, in conventional base station amplifiers the supply voltage is connected to the amplifying transistor via a ¼ wavelength line (λ/4 line). The ¼ wavelength line technique is space-consuming and provides only a narrow band solution. The ¼ wavelength line is based on the theory that, if a terminal B of a two-port network is short-circuited, which means a voltage equal to zero and a short circuit current $I_{short}$, then an open circuit situation is found at a terminal A of the two-port network, which means a current equal to zero and a short circuit Voltage $V_{short}$ is measured on terminal A, and vice versa. The ¼ wavelength line can thus be used as a filter. However, due to the path length of the ¼ wavelength line it is very difficult to obtain a low-ohmic short for higher frequencies up to 10 MHz. Furthermore, the ¼ wavelength line technology is space consuming which is not desired in a world of miniaturization.

FIG. 1 shows the conventional bias voltage supply arrangement comprising a power supply connection layer 16 and decoupling capacitances 18. A RF amplifier device 2 comprises an active die 4 and a DC blocking capacitance 6. The active die 4 is connected via bond wires 8 forming an INSHIN inductance to the DC blocking capacitance 6 and via further bond wires 9 to a matching circuit 10. The matching circuit 10 is connected to a RF-short capacitance 20 and to the decoupling capacitances 18 via a ¼ wavelength line 12. The decoupling capacitances 18 are connected between the power supply connection layer 16 and ground 14.

In general, an amplifier of a base station features an INSHIN inductor (INSHIN=INternal SHunt INductor) at its output in order to compensate the output capacitance. The INSHIN inductor is incorporated in the transistor package and is formed by the bond wires 8 which are connected with the active die 4 and the DC blocking capacitance 6. The INSHIN inductor is commonly used in RF-power transistors having an output power above 20 W. The INSHIN inductor which is formed by the bond wires 8 between the active die 4 and the DC blocking capacitance 6, is in series with a DC blocking capacitance 6. This serial circuit is in parallel to the output of the active die 4. This INSHIN inductor 8 is connected to ground with the DC blocking capacitance 6.

As mentioned above in connection with the principle of ¼ wavelength line, the short of a ¼ wavelength line can be compared with a RF-termination capacitance which is connected to ground, which blocks the DC and shorts the RF-signals. When frequency changes, then the electrical length is not ¼ wavelength anymore, and the DC bias of the power supply connection layer 16 will interfere with the matching circuit 10 so the ¼ wavelength line 12 works only over a rather narrow frequency band or, with other words, it is narrow-banded. The electrical length of a ¼ wavelength line stub on 2 GHz is 7–20 mm which depends on the material of the printed circuit board.

The ¼ wavelength line solution introduces a long path from the transistor to the capacitances. By increasing the path length increased the impedance is increased also. For very low frequencies (<500 kHz) the impedance of the path length is negligible, but the higher the differential frequency is the more important the path length becomes. This makes it difficult to achieve a good short on the actual transistor at frequencies above 5–10 MHz.

For example, if a capacitance for shorting the differential frequency is approximately 20 mm spaced apart from the nearest transistor die, this proves to be too long a distance to short differential frequencies which are higher than 5 MHz. In other words, if the DC bias is provided, then a ¼ wavelength line is required because the DC bias of the power supply connection layer 16 must not disturb the functioning of the RF matching circuit 10. This solution consumes space on circuit boards. In a world of extremely small designs it is undesired to consume too much space on circuit boards. Also the path length from the transistor to the capacitances which shorts the differential frequency, is undesirably long.

For a good performance of the amplifier the differential frequency must be shorted. Because influences from the power supply to the matching circuit have to be avoided, decoupling capacitances 18 are provided to short the differential frequencies at lower frequencies. The decoupling capacitances 18 are connected to the power supply connection layer 16 and are required as additional filters.

In general, an amplifier of a base station features a shunt inductor 8 at its output in order to compensate the output capacitance. The shunt inductor is commonly used with RF-power transistors with an output power above 20 W. The shunt inductor 8 is connected in series with a DC blocking capacitance 6 and is coupled to ground through the DC blocking capacitance 6.

European patent application EP 0 368 329 A discloses a self equalizing multi-stage radio frequency power amplifier. The linearity and efficiency of a radio frequency two-stage power amplification device are increased by employing two tuned circuits in a driver stage and two tuned circuits in a high power stage. After selecting elements of tuned circuits in order to optimize the high power stage for efficiency, linearity and power output, elements are selected for tuned circuits in order to cause the intermodulation output components associated with the driver stage to have a 180° phase angle relative to the intermodulation output components associated with the individual high power stage. This phase angle relationship has the effect that the intermodulation output component products from the driver and high power stages are canceled. The circuit comprising the shunt inductor is in series with a DC blocking capacitance is connected to ground and forms a circuit stage outside of the transistor device.

British patent application GB 2 225 683 A discloses a high frequency amplifier which prevents parametric oscillations. Parasitic, parametric oscillations in the amplifier may be prevented by coupling a resonant circuit to either the input or the output of the amplifier. The resonant circuit has a resonant frequency equal to one half the frequency of the amplified signal. The resonant circuit comprises only a portion of the inductor connected to the output or input of the amplifier.

In patent application GB 2 225 683 A the DC power supply is not fed to a DC blocking capacitance. Furthermore, the differential frequencies are not decoupled by a DC blocking capacitance. Also the shunt inductance is a device separate from the transistor and is not accessible for the customer.

It is an object of the present invention to provide a an RF amplifier device for decoupling at higher frequencies.

To achieve this object, the present invention provides a RF amplifier device according to the opening paragraph, said compensating circuit being coupled to a power supply terminal, said power supply terminal being connected to a decoupling circuit.

In the device according to the invention the path length from the decoupling circuit to the amplifying transistor is dramatically reduced by connecting the power supply and/or the decoupling circuit to the compensating capacitance. This results in a higher decoupling frequency and a simple bias connection. Furthermore the area required by the circuit is decreased, resulting in lower production costs.

According to a preferred embodiment of the device according to the invention the RF amplifier device comprises an amplifier element and a compensating circuit comprising an internal shunt inductor having a compensating inductance and a compensating capacitance, said compensating circuit being arranged in parallel to the amplifier element output to compensate an input and/or an output capacitance of the device, said device further comprising a power supply terminal connected to said amplifier element through said decoupling circuit, whereby the decoupling circuit is coupled to the compensating capacitance via said power supply terminal. By coupling the power supply and the decoupling circuit to the compensating capacitance, the path length from the decoupling circuit to the amplifying transistor is reduced. The results are a higher decoupling frequency and a simple bias connection.

According to a further preferred embodiment of the device according to the invention the decoupling circuit is coupled to the compensating capacitance through an inductance element. By using the connecting element as a functional element, space of the circuit board and time and money in production can be saved because it is not necessary to buy and mount a separate inductance.

According to another further preferred embodiment of the device according to the invention the inductance element is at least one bond wire. The value of the inductance can be easily matched to the conditions of the customer by the number of bond wires, the diameter and the length thereof.

According to another further preferred embodiment of the device according to the invention the decoupling circuit is connected between ground and the power supply. The result is a simpler arrangement. Furthermore, the space required by the circuit is decreased.

According to another further preferred embodiment of the device according to the invention the decoupling circuit comprises at least one decoupling capacitance. The impedance of the decoupling capacitance can be matched to the conditions of the circuit by the number of the decoupling capacitances.

According to another further preferred embodiment of the device according to the invention a power supply line is provided comprising a power supply connection area, a decoupling circuit connection area and a bond wire connection area, which line is arranged next to the compensating capacitance. The result is a much higher decoupling frequency and a simple power supply connection layer ion.

According to another preferred embodiment of the device according to the invention said RF amplifier device is a transistor.

According to another further preferred embodiment of the device according to the invention, the amplifier element with the compensating circuit, the decoupling circuit and the connection line having the connection area for a power supply and a connection area for the decoupling circuit are arranged on a circuit board, wherein the connection line is located on the circuit board next to the compensating capacitance. The narrow location of the above mentioned functional parts contribute to decrease the space of the circuit.

According to another further preferred embodiment of the device according to the invention a RF amplifier device including an amplifier element and a compensating circuit is disclosed, comprising an internal shunt inductor having a compensating inductance in series with a compensating capacitance, which are arranged in parallel to a terminal of the amplifier element to compensate a terminal capacitance of the amplifier element, said device further comprising a decoupling and power supply lead connected to the compensating capacitance and/or a decoupling circuit and/or a combination of the compensating capacitance and the decoupling circuit.

In the device the path length from the decoupling circuit to the amplifying transistor is reduced by connecting the power supply and/or the decoupling circuit to the compensating capacitance. This leads to a higher decoupling frequency and a simple bias connection. Furthermore the space required by the circuit is decreased, resulting in a decrease in production costs.

According to another preferred embodiment of the device according to the invention, the terminal of the amplifier element is an input terminal and/or an output terminal of the amplifier element. An advantageous feature of this embodiment is that the capacitance of the input and/or output terminal are compensated.

According to another further preferred embodiment of the device according to the invention, the decoupling circuit is connected to the compensating capacitance through an inductance element.

According to another further preferred embodiment of the device according to the invention, the inductance element comprises at least one bond wire.

According to another further preferred embodiment of the device according to the invention, the decoupling circuit and/or the combination of the compensating capacitance and the decoupling circuit are/is connected between the decoupling and power supply lead and the compensating capacitance or between the decoupling and power supply lead and the terminal of the amplifier element. In this preferred embodiment the path length from the decoupling circuit to the amplifying transistor is reduced by connecting the power supply and/or the decoupling circuit to the compensating capacitance. This leads to a higher decoupling frequency and a simple bias connection. Furthermore the space required by the circuit is decreased and the decoupling frequency is increased.

According to another further preferred embodiment of the device according to the invention, the decoupling circuit comprises at least one decoupling capacitance.

According to another further preferred embodiment of the device according to the invention, the amplifier element is a transistor.

According to another further preferred embodiment of the device according to the invention, the amplifier element with the compensating circuit and/or the decoupling circuit and/or the combination of the compensating capacitance and the decoupling circuit and the decoupling and power supply lead are arranged on a circuit board. The integration on one circuit board leads to a further miniaturization of the circuit, which saves space on a circuit board.

A module according to the invention comprises a RF amplifier device, said module further comprising a mounting base for a discrete transistor on which a printed circuit board (pcb) is soldered; a matching network; a bias circuit; at least one decoupling capacitance. The module has the advantage, that the path lengths are decreased. This leads to a higher decoupling frequency.

According to a preferred embodiment of the module according to the invention, the printed circuit board is a multilayer printed circuit board. This feature decreases the area of the circuit board tremendously.

According to a further preferred embodiment of the module according to the invention, the printed circuit board contains all or a part of the matching network and/or the bias circuit. This feature enhances the flexibility of circuit design and mounting technology, because the matching network and/or the bias circuit can be mounted at least to a part on the printed circuit board.

According to another further preferred embodiment of the module according to the invention, a signal path is on a top layer and a decoupling and power supply path is on a middle layer of the pcb or vice versa.

According to another further preferred embodiment of the module according to the invention, the decoupling and power supply path is in parallel to the dies of an amplifier element, a compensating capacitance, a decoupling circuit, a combination of the compensating capacitance and the decoupling circuit.

A method according to the invention is arranged for decoupling a RF amplifier device comprising an amplifier element with a frequency dependent gain, said frequency dependence being caused by an input and/or an output capacitance, said frequency dependence being compensated by a compensating circuit, said compensating circuit being coupled to a power supply terminal, said power supply terminal being coupled to ground via a frequency dependent impedance.

In the method according to the invention the path length from the decoupling circuit to the amplifying transistor is dramatically reduced by connecting the power supply and/or the decoupling circuit to the compensating capacitance. This results in a higher decoupling frequency and a simple bias connection. Furthermore the area required by the circuit is decreased, resulting in lower production costs.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which there are illustrated and described preferred embodiments of the present invention.

FIGS. 10–13 show different embodiments in INSHIN decoupling and power supply in modules.

Figure 2:
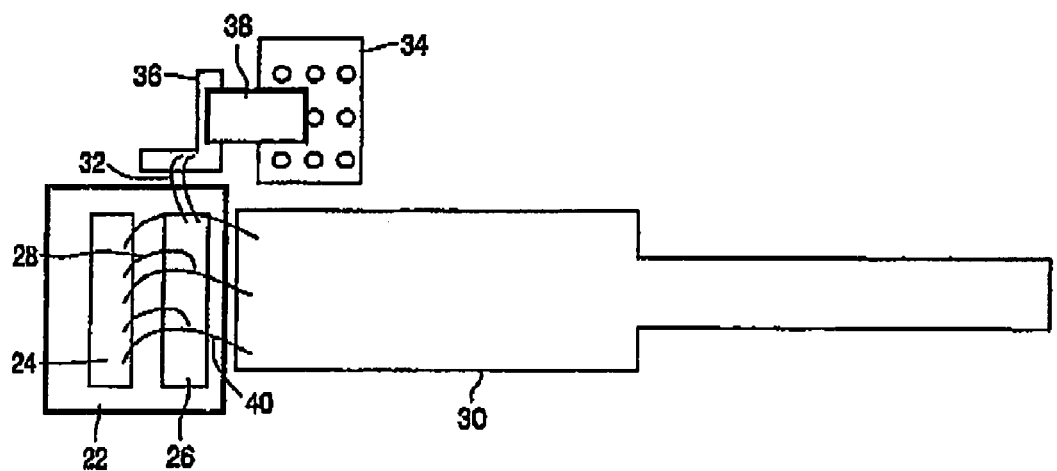
FIG. 2 shows an arrangement corresponding to the present invention.

FIG. 2 shows an arrangement according to the present invention. The Figure shows an RF amplifier device 22 which comprises the active die with a semiconductor amplifier element 24 and the DC blocking capacitance 26. The active die 24 is connected via bond wires 28 with the DC blocking capacitance 26. The DC blocking capacitance 26 is connected via bond wires 32 to the power supply connection layer 36.

The active die 24 is connected via bond wires 40 to the matching circuit 30. The power supply connection layer 36 is connected with one side of the decoupling capacitance 38. The other side of the decoupling capacitance 38 is connected to ground 34. The bond wire 28 and the DC blocking capacitance 26 forms the INSHIN-circuit. The DC blocking capacitance 26 is a RF short This means that any circuitry may be connected to the DC blocking capacitance 26 without effecting the operation of the RF matching circuit 30. The active die 24 is connected to the matching circuit 30 through bond wires 40.

By connecting the power supply connection layer 36 and the decoupling capacitance 38 to the DC blocking capacitance 26, the path length from the decoupling capacitance 38 to the active die 24 is dramatically reduced. The result is a much higher decoupling frequency and a simple connection to the power supply connection layer 36.

Figure 1:
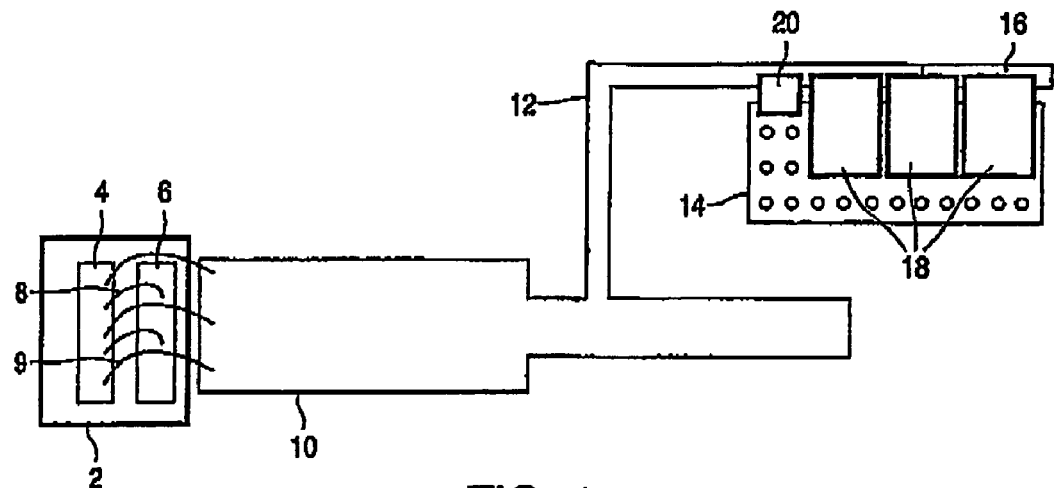
FIG. 1 shows a conventional arrangement of the bias supply and the decoupling capacitances.

In other words, the power supply connection layer 36 is connected directly to the DC blocking capacitance 26 between the INSHIN inductor which is formed by the bond wire 28, and ground. The DC blocking capacitance 26 is a very good short for the working frequency and connections which are made to it, do not influence at all the performance of the active die 24 or the matching circuit 30. Directly connecting the power supply connection layer 36 to the DC blocking capacitance 26 will make the ¼ wavelength line 12 of FIG. 1 obsolete.

Also the decoupling capacitance 38 to short the unwanted differential frequencies or tones can be placed directly next to the active die 24. This is a dramatic decrease of path length from the decoupling capacitance 38 to the active die 24, resulting in a good short for frequencies up to 50 MHz.

Figure 3:
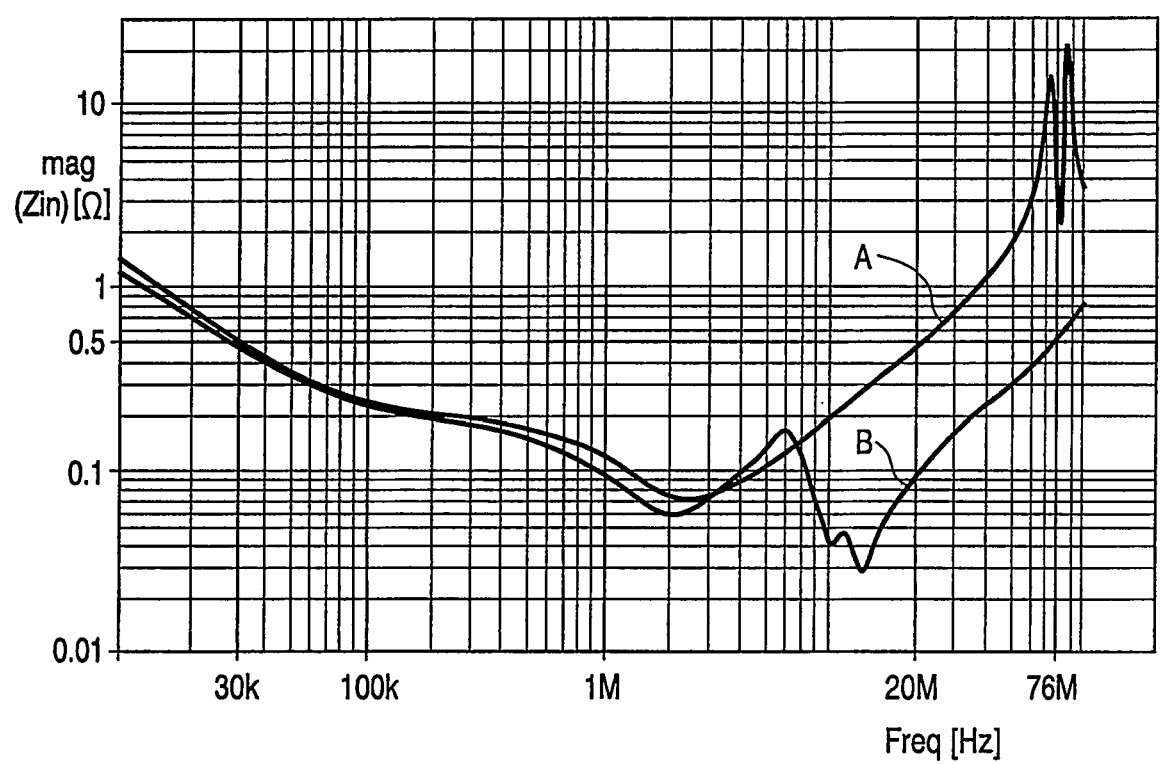
FIG. 3 is a diagram showing the difference in magnitude of the impedance between an RF amplifier device with traditional decoupling and an RF amplifier device with a decoupling arrangement of a preferred embodiment of the invention.

FIG. 3 is a diagram showing the difference in magnitude of the impedance between an RF amplifier device with traditional decoupling shown as curve A and a RF amplifier device with a decoupling arrangement of the invention shown as curve B. The unit of the vertical axis is Ω. The unit of the horizontal axis is Hz. In both decoupling arrangements, simple 100 nF 1206 SMD capacitances are used.

When an impedance level of 0.5 Ω is considered as a sufficient short, then the traditional decoupling works from 30 kHz to 20 MHz as curve A is below the 0,5 Ω level up to 20 MHz. As curve B stays below to 0,5 Ω line up to 75 MHZ, the decoupling arrangement of the invention works from 30 kHz to 75 MHz. This clearly shows the superior performance of the RF amplifier device having the decoupling arrangement of the invention.

Figure 4:
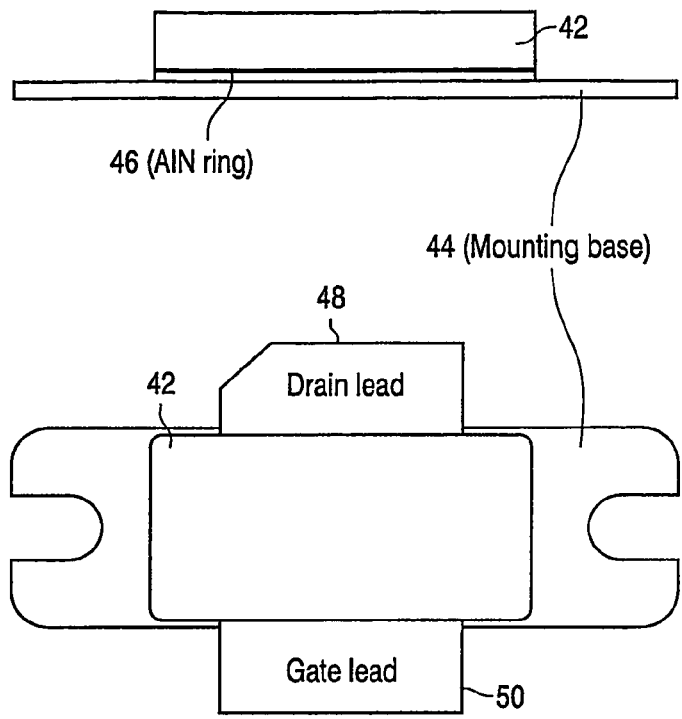
FIG. 4 shows a standard case of a RF discrete power transistor.

FIG. 4 shows in the upper part a side view and in the lower part a top view of a standard RF discrete power transistor. The standard power transistor 42 is mounted on a mounting base 44. An aluminum nitrite (AlN) ring 46 is mounted between the transistor 42 and the mounting base 44. The transistor 42 is connected to other circuit parts by the drain lead 48 and the gate lead 50.

In a standard transistor package used for LDMOS-base station transistors, a copper/TUNGSTEN alloy mounting base connects the transistor 42 electrically and thermally to ground. On this mounting base 44, an aluminum nitrite ring 46 is mounted, on which the leads 48, 50 are connected, electrically separated from the mounting base 44 by this AlN ring 46. The leads 48, 50 connect the transistor 42 to the matching network on the circuit board and transport both DC-biases as well as RF power.

Figure 5:
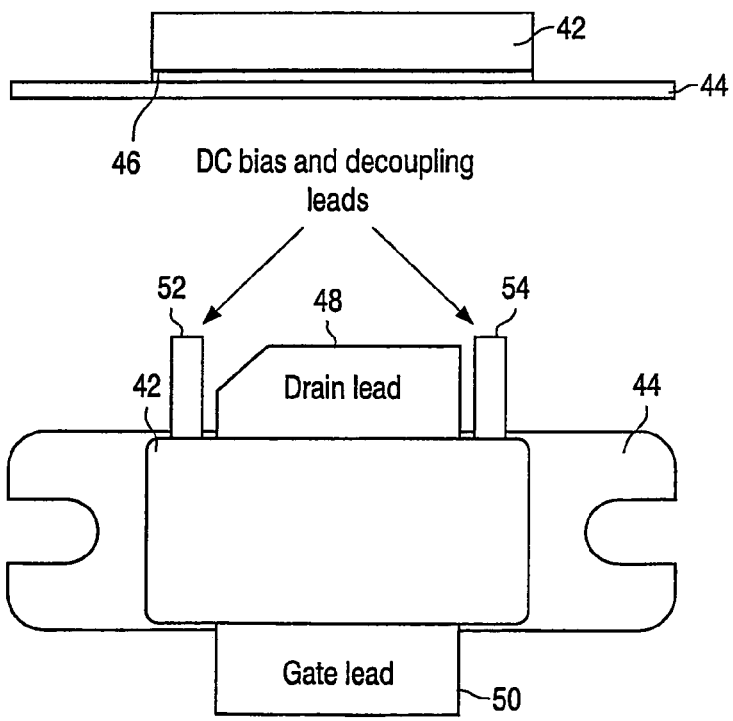
FIG. 5 shows the case of an adapted RF power transistor with two extra leads.

FIG. 5 shows the case of an adapted RF discrete power transistor with two extra leads 52, 54. In FIG. 5, equivalent parts with equivalent numbers are shown as in FIG. 4. The adapted power transistor 42 of FIG. 5 transports the RF power by the middle leads 48 and 50 and the DC bias to the transistor 42 of FIG. 5 as provided by one or both outer leads 52 and 54. Furthermore, the leads 52 and 54 are used for decoupling the transistor 52 of FIG. 5 from the connected circuit parts. The adapted RF power transistor of FIG. 5 is used in the following descriptions of INSHIN decoupling in discrete transistors.

FIGS. 6 to 9 show different embodiments of INSHIN decoupling and power supply in discrete transistors. In the FIGS. 6 to 9 only one half of drain lead of a transistor is shown.

The transistor die 56 is connected to the INSHIN capacitance 64 by the bond wires 58, 60 and 62. The capacitance 64 and the inductance of the bond wires 58, 60 and 62 compensate the capacitance of an input or output terminal of the transistor die 56. The transistor die 56 is connected to the RF lead 70 by the bond wires 66 and 68. The decoupling and power supply lead 76 is connected to the INSHIN capacitance 64 by the bond wires 72 and 74. The decoupling and power supply lead 76 provides power to the transistor die 56 and is used for decoupling of the transistor die 56 from the connected circuit parts. The decoupling and power supply lead 76 and the RF lead 70 are mounted on the AlN ring 78.

The transistor die 80 is connected to the INSHIN capacitance 92 by the bond wires 82, 84 and 86. The function of the INSHIN capacitance 92 and the bond wires 82, 84 and 86 is the same as described above. The transistor die 80 is connected to the RF lead 70 by the bond wires 88 and 90. The INSHIN capacitance 92 is connected to the decoupling and power supply lead 98 by the bond wires 94 and 96. The decoupling and power supply lead 98 is also mounted on the AlN ring 78.

This embodiment is the basic embodiment. The embodiment shows a discrete transistor with an external connection to the INSHIN capacitance. Advantages of this embodiment are the simple construction, the supply with DC bias and the decoupling through separate leads, no need for a ¼ wavelength line on RF paths to bias the transistor and a biasing and decoupling close to the transistor.

Figure 7:
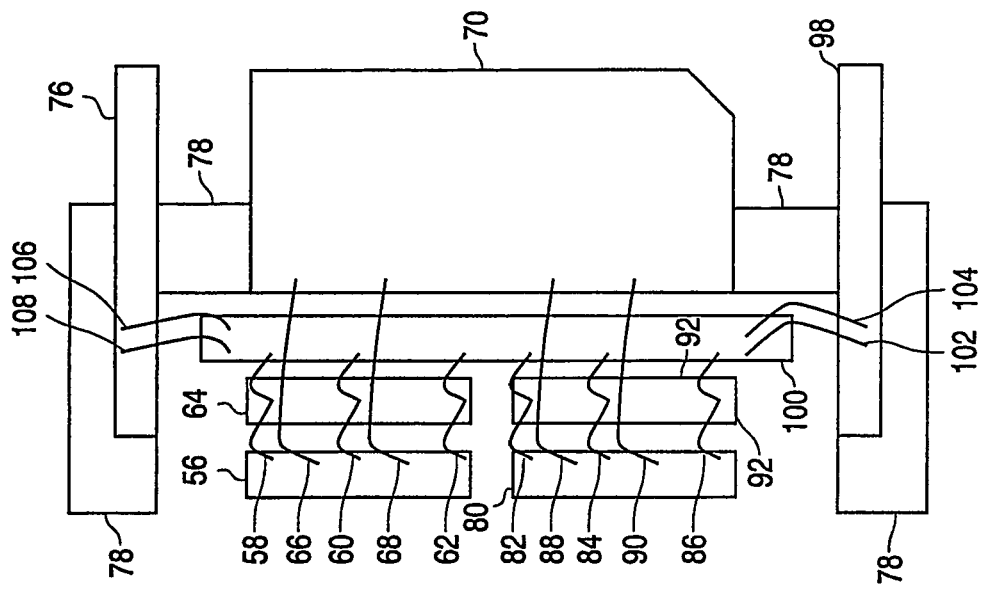
FIGS. 6–9 show different embodiments of INSHIN decoupling and power supply in discrete transistors.
Figure 6:
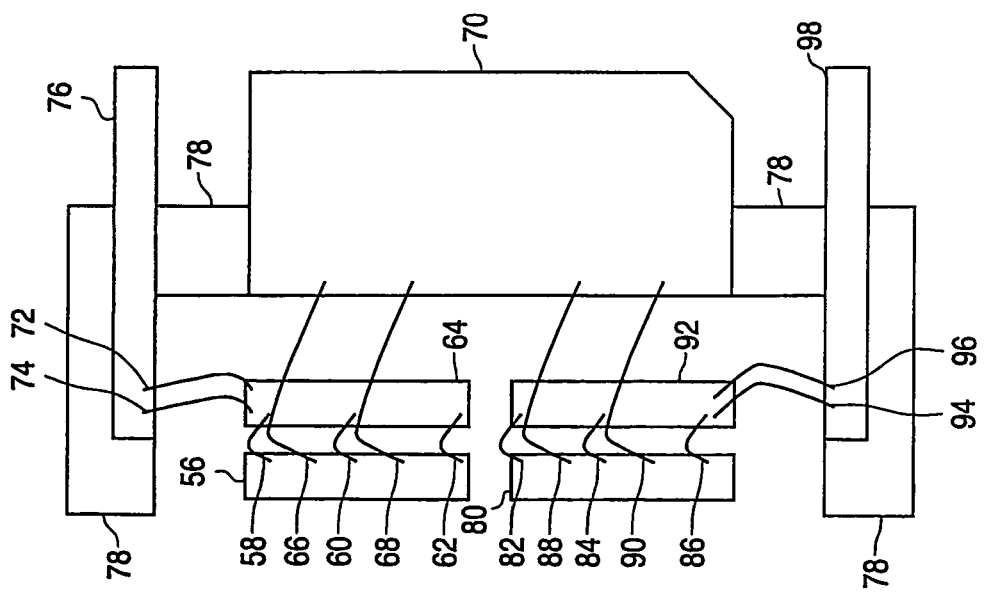

The embodiment of FIG. 7 is rather similar to the embodiment of FIG. 6. In FIG. 7 a decoupling capacitance 100 makes the difference to the embodiment of FIG. 6. The decoupling capacitance 100 is connected to the decoupling in power supply lead 76 by the bond wires 106 and 108, and the decoupling capacitance 100 is connected to the decoupling and power supply lead 98 by the bond wires 102 and 104. The bond wires 58, 60 and 62 connect the transistor die 56 to the INSHIN capacitance 64 and to the decoupling capacitance 100. The bond wires 82, 84 and 86 connect the transistor die 80 to the INSHIN capacitance 92 and to the decoupling capacitance 100. The capacitance 100 could be made for instance as a strip of Hi-K material.

An advantage of the capacitance 100 is that the capacitance enhances the low frequency decoupling significantly. Further advantages are that the DC bias and the decoupling of the transistor 56 and 80 is provided through separate leads 76, 98 and that there is no need for ¼ wavelength line to bias the transistors 56 and 80.

Figure 8:
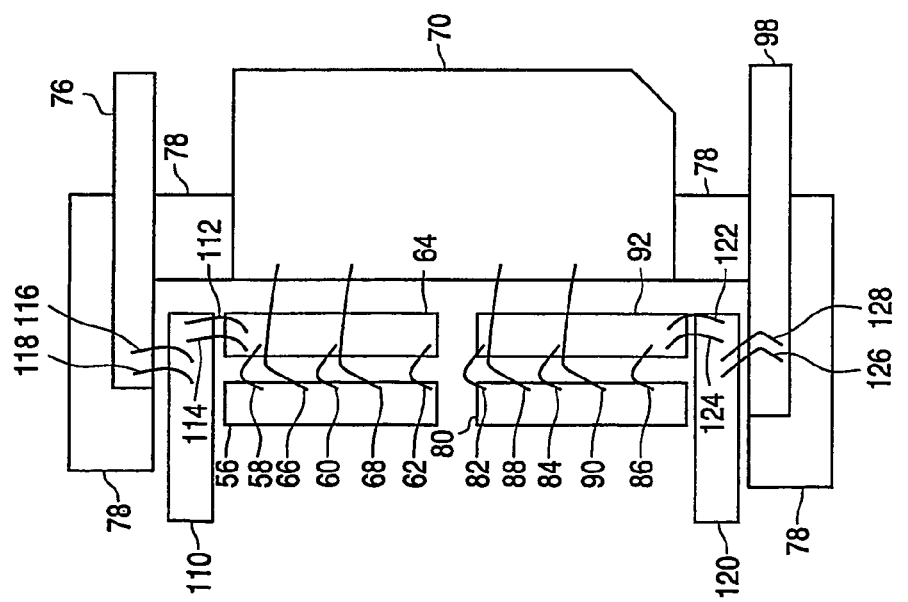

FIG. 8 shows an embodiment, which is rather similar to the embodiment of FIG. 7. The main difference between FIG. 7 and FIG. 8 is, that the decoupling capacitance 100 of FIG. 7 is divided into two decoupling capacitances 110 and 120. The decoupling capacitance 110 is connected to the decoupling in power supply lead 76 by the bond wires 116 and 118. The decoupling capacitance 110 is connected to the INSHIN capacitance 64 by the bond wires 112 and 114. The decoupling capacitance 120 is connected to the INSHIN capacitance 92 by the bond wires 122 and 124. The decoupling capacitance 120 is connected to the decoupling and power supply lead 98 by the bond wires 126 and 128.

The two decoupling capacitances 110 and 120 at the side of the transistor dies 56 and 80 and at the side of the INSHIN capacitance dies 64 and 92 allow shorter drain wires to the lead. This may be advantageous for matching purposes.

Figure 9:
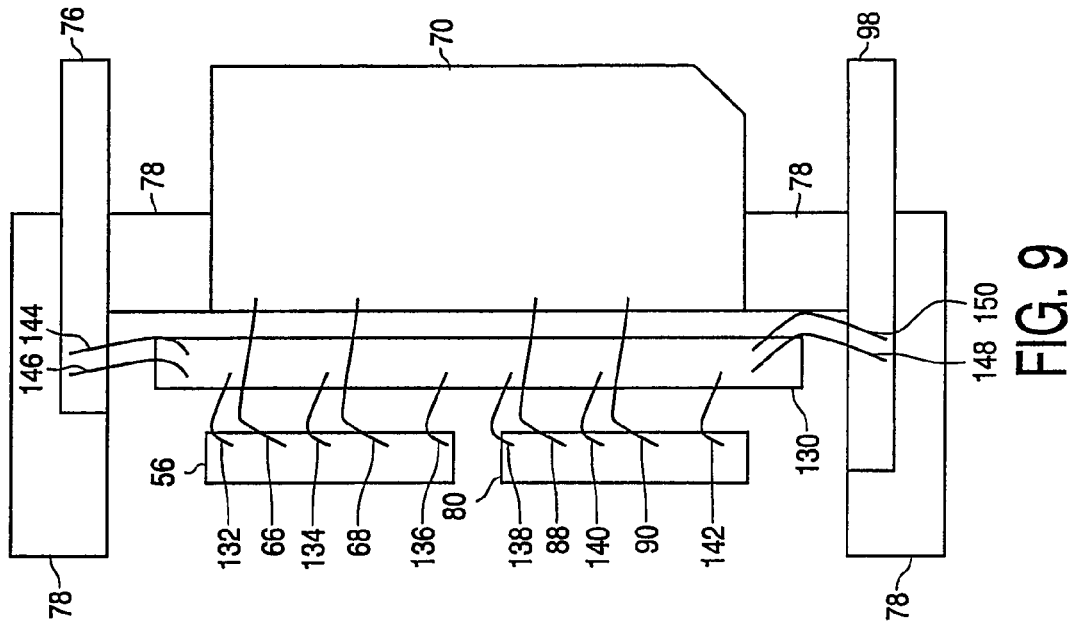

FIG. 9 shows an embodiment, in which the transistor die 56 is connected to a capacitance 130, which combines an INSHIN and a decoupling capacitance by the bond wires 132, 134 and 136. The transistor die 80 is connected to the capacitance 130 by the bond wires 138, 140 and 142. The capacitance 130 is connected to the decoupling and power supply lead 76 by the bond wires 144 and 146. The capacitance 130 is connected to the decoupling and power supply lead 98 by the bond wires 148 and 150.

If the decoupling capacitance is sufficient to effectively shorten the carrier frequency, the INSHIN capacitance may be omitted to combine two functions in one capacitance. The first function which is combined is shortened of low frequency products, which is normally done by the decoupling capacitance. The second function is shortening the signal at the carrier frequency which is normally done by the INSHIN capacitance.

Advantages of the embodiment of FIG. 9 are saving of space inside the transistor, saving the use of the INSHIN capacitance, very good low frequency decoupling. Further advantages of this embodiment is that it is much easier to manufacture than the embodiments of the state of the art and the short drain bond wires, which may be advantageous in improving matching properties.

In order to demonstrate the special features of the embodiment shown in the FIGS. 6–9, only the differences between the embodiments are described. Equal parts have equal numbers.

FIGS. 10 to 13 show different embodiments of INSHIN decoupling and power supply in a module. All designs used in a discrete transistor can also be used in a module. A module features a mounting base as a discrete transistor, on which a printed circuit board (pcb) is soldered. This circuit board may contain all or a part of the matching network, all or some parts of the bias circuit as well as decoupling capacitances. An advantage of a module is that a multilayer printed circuit board can be used (where a discrete transistor only has a AlN ring), which extends the number of connecting possibilities.

FIG. 10 shows in the upper part a top view of an embodiment of INSHIN decoupling and power supply in a module. A side view is shown in the lower part of FIG. 10.

The transistor die 210 is connected to a decoupling capacitance 208 by bond wires 218, 220 and 222. The transistor die 210 is also connected in parallel to a RF path 206 by bond wires 230 and 232. The decoupling capacitance 208 is connected to a decoupling and power supply path 202.

A transistor die 212 is connected to the decoupling capacitance 208 by bond wires 224, 226 and 228. The transistor die 212 is connected to the RF path 206 by bond wires 234 and 236. The decoupling capacitance 208 is connected to the decoupling and power supply path 204.

The lower part of FIG. 10 shows a side view of the embodiment. The RF path 206 is mounted on a top layer 238 and the decoupling and power supply path 204 is mounted on a middle layer 240. A connection is made by vias to the top layer 238, where decoupling capacitances can be placed.

The advantages of the embodiment are that DC biasing and decoupling is done through separate paths on the printed circuit board 200. There is no need for ¼ wavelength line on the RF path 206 to bias the transistor 210 and 212. The biasing and decoupling is close to the transistors 210 and 212. There is no DC bias current to flow laterally through capacitance. Instead the DC bias current flows from the printed circuit board 200 to the transistor dies 210, 212 via the bond wires 218, 220, 222, 224, 226, 228, 230, 232, 234 and 236.

FIG. 11 shows basically the same as FIG. 10. The difference is that the RF signal path 206 is in the middle layer 240 and the decoupling and power supply path 204 is on the top layer 238. The advantages are as described above. A further advantage of this design is that is has shorter drain bond wires. This is an advantage to the previous layout for broad band matching.

FIG. 12 shows an embodiment rather similar to the embodiments of FIGS. 10 and 11. The difference to the embodiments described above is that there is a separate decoupling capacitance 208. The transistor die 210 is connected to the INSHIN capacitance 214, the decoupling capacitance 208 and to the decoupling and power supply path by the bond wire 242, 244 and 246. The transistor die 210 is connected to the RF path 206 by the bond wires 230 and 232. The transistor 212 is connected to the INSHIN capacitance 216, the decoupling capacitance 208 and the decoupling and power supply path by the bondwires 248, 250 and 252. The transistor 212 is connected to the RF path 206 by the bondwires 234 and 236. The lower part of FIG. 12 shows that the RF path 206 is on the top layer 238 and the decoupling and power supply path 204 is on the middle-layer 240.

The embodiment as shown in FIG. 12 is like the embodiment as shown in FIG. 7, but the power supply connection is in parallel to the dies 208, 210, 212, 214 and 216.

Advantages are that the capacitance 208 inside the transistor enhances the low frequency decoupling dramatically. The biasing with DC and the decoupling of the transistors 210 and 212 is done by separate paths on the printed circuit board 200. There is no need for ¼ wavelength line to bias the transistors 210 and 212. The biasing and the decoupling is close to the transistors 210 and 212. There is no bias current to flow laterally through the capacitances 208, 214 and 216. Instead bias current flows from the printed circuit board to the transistors 210 and 212 via bond wires 242, 244, 246, 248, 250 and 252.

FIG. 13 shows an embodiment of a combined INSHIN and decoupling capacitance 266 as FIG. 9. The transistor 210 is connected to the decoupling and power supply path and to the capacitance 266 by the bond wires 254, 256 and 258. The transistor 212 is connected to the combined capacitance 266 and to the decoupling and power supply path by the bond wires 260, 262 and 264. The transistor 210 is connected to the RF path 206 by the bond wires 230 and 232. The transistor 212 is connected to the RF path 206 by the bond wires 234 and 236. The lower part of FIG. 13 shows the structure of the embodiment.

An advantage of the embodiment are that the embodiment saves space inside the module. Furthermore the embodiment saves the use of INSHIN capacitances, it has a very good low frequency decoupling, while at the same time the manufacture is easier if no separate INSHIN capacitance is needed and the drain bond wires are rather short. This is useful for matching.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. An RF amplifier device (22) comprising an amplifier element (24) with a frequency dependent gain, said frequency dependence being caused by an input and/or an output capacitance, said frequency dependence being compensated by a compensating circuit (26, 28), said compensating circuit (26, 28) for compensating for said frequency dependence being directly connected to a power supply connection terminal (36), said power supply connection terminal (36) being connected to a decoupling circuit (38).

2. A device as claimed in claim 1, comprising an amplifier element (24) and a compensating circuit (26, 28) comprising an internal shunt inductor having a compensating inductance (28) and a compensating capacitance (26), said compensating circuit being arranged in parallel to the amplifier element output (24) to compensate an input and/or an output capacitance of the device, said device further comprising a power supply terminal (36) connected to said amplifier element through said decoupling circuit (38), whereby the decoupling circuit (38) is coupled to the compensating capacitance (26) via said power supply terminal (36).

3. A device as claimed in claim 2, wherein the decoupling circuit (38) is coupled to the compensating capacitance (26) through an inductance element (32).

4. A device as claimed in claim 2, wherein the inductance element comprises at least one bond wire (28, 32, 40).

5. A device as claimed in claim 2, wherein the decoupling circuit (38) is connected to ground (34) and the power supply (36).

6. A device as claimed in claim 3, wherein the decoupling circuit comprises at least one decoupling capacitance (38).

7. A device as claimed in claim 2, wherein a power supply line is provided comprising a power supply connection area, a decoupling circuit connection area and a bond wire connection area, which line is arranged next to the compensating capacitance (26).

8. A device as claimed in claim 2, wherein said RF amplifier device (24) is a transistor.

9. A device as claimed in claim 1, in which the amplifier element (24) with the compensating circuit (26, 28), the decoupling circuit and the connection line having the connection area for a power supply (36) and a connection area for the decoupling circuit (38) are arranged on a circuit board, wherein the connection line is located on the circuit board next to the compensating capacitance (26).

10. A device as claimed in claim 1, comprising an amplifier element (56, 80) and a compensating circuit comprising an internal shunt inductor having a compensating inductance (58, 60, 62) in series with a compensating capacitance (64, 92), which are arranged in parallel to a terminal of the amplifier element (56, 80) to compensate a terminal capacitance of the amplifier element (56, 80), said device further comprising a decoupling and power supply lead (76, 98) connected to the compensating capacitance (64, 92) and/or a decoupling circuit (100) and/or a combination of the compensating capacitance and the decoupling circuit (130).

11. A device as claimed in claim 10, wherein the terminal of the amplifier element (56, 80) is an input terminal and/or an output terminal of the amplifier element (56, 80).

12. A device as claimed in claim 10, wherein the decoupling circuit (100) is connected to the compensating capacitance (64, 92) through an inductance element (58, 60, 62, 82, 84, 86).

13. A device as claimed in claim 10, wherein the inductance element comprises at least one bond wire (58, 60, 62, 82, 84, 86).

14. A device as claimed in claim 10, wherein the decoupling circuit (100, 110, 120) and/or the combination of the compensating capacitance and the decoupling circuit (130) are/is connected between the decoupling and power supply lead (76, 98) and the compensating capacitance (64, 92) or between the decoupling and power supply lead (76, 98) and the terminal of the amplifier element (56, 80).

15. A device as claimed in claim 10, wherein the decoupling circuit comprises at least one decoupling capacitance (100, 110, 120).

16. A device as claimed in claim 10, wherein the amplifier element (56, 80) is a transistor.

17. A device as claimed in claim 1, in which the amplifier element (56, 80) with the compensating circuit and/or the decoupling circuit (100, 110, 120) and/or the combination of the compensating capacitance and the decoupling circuit (130) and the decoupling and power supply lead (76, 98) are arranged on a circuit board.

18. A module comprising an RF amplifier device as claimed in claim 1 comprising
 a mounting base (44) for a discrete transistor on which a printed circuit board (pcb) is soldered;
 a matching network;
 a bias circuit;
 at least one decoupling capacitance.

19. A module as claimed in claim 18, wherein the printed circuit board is a multilayer printed circuit board (200).

20. A module as claimed in claim 18, wherein the printed circuit board (200) contains all or a part of the matching network and/or the bias circuit.

21. A module as claimed in claim 18, wherein a signal path (206) is on a top layer (238) and a decoupling and power supply path (202, 204) is on a middle layer (240) of the pcb (200) or vice versa.

22. A module as claimed in claim 18, wherein the decoupling and power supply path (202, 204) is in parallel to the dies of an amplifier element (210, 212) and/or a compensating capacitance (214, 216) and/or a decoupling circuit (208) and/or a combination of the compensating capacitance and the decoupling circuit (266).

23. A method for decoupling an RF amplifier device (22) comprising an amplifier element (24) with a frequency dependent gain, said frequency dependence being caused by an input and/or an output capacitance, said frequency dependence being compensated by a compensating circuit (26, 28), said compensating circuit (26, 28) for compensating for said frequency dependence being directly connected to a power supply connection terminal (36), said power supply connection terminal (36) being coupled to ground (34) via a frequency dependent impedance (38).

* * * * *